United States Patent
James et al.

(10) Patent No.: US 11,093,663 B2
(45) Date of Patent: *Aug. 17, 2021

(54) GEARSETS

(71) Applicant: ROMAX TECHNOLOGY LIMITED, Nottingham (GB)

(72) Inventors: Barry James, Cranage (GB); Michael Platten, Nottingham (GB); Sharad Jain, Nottingham (GB); Kathryn Taylor, Nottingham (GB); Christopher Halse, Nottingham (GB); Maik Hoppert, Leipzig (DE)

(73) Assignee: ROMAX TECHNOLOGY LIMITED, Cobham (GB)

(*) Notice: Subject to any disclaimer, the term of this patent is extended or adjusted under 35 U.S.C. 154(b) by 403 days.

This patent is subject to a terminal disclaimer.

(21) Appl. No.: 15/884,416

(22) Filed: Jan. 31, 2018

(65) Prior Publication Data
US 2018/0218109 A1    Aug. 2, 2018

(30) Foreign Application Priority Data

Jan. 31, 2017   (GB) .................................. 1701606
Feb. 1, 2017    (GB) .................................. 1701683
Feb. 9, 2017    (GB) .................................. 1702182

(51) Int. Cl.
*G06F 30/17*    (2020.01)
*F16H 57/00*    (2012.01)
(Continued)

(52) U.S. Cl.
CPC .............. *G06F 30/17* (2020.01); *F16H 1/28* (2013.01); *F16H 57/00* (2013.01);
(Continued)

(58) Field of Classification Search
CPC . G06F 30/17; F16H 1/28; F16H 57/00; F16H 55/0806; F16H 2057/0087; Y02B 10/30
See application file for complete search history.

(56) References Cited

U.S. PATENT DOCUMENTS 4,276,785 A    7/1981  Rouverol
5,297,054 A    3/1994  Kienzle et al.
(Continued)

FOREIGN PATENT DOCUMENTS

CN    101216090 A    7/2008
CN    104573389 A    4/2015
(Continued)

OTHER PUBLICATIONS

Barton et al. "Impact of Viscocity Modifiers on Gear Oil Efficiency and Durability: Part II", SAE Int. K. Fuels Lubr. 6(2) 2013 pp. 295-310. (Year: 2013).*
(Continued)

*Primary Examiner* — Iftekhar A Khan
(74) *Attorney, Agent, or Firm* — Maschoff Brennan

(57) ABSTRACT

A method for designing a gearset meeting one or more design targets is provided. In particular, the design target is efficiency. Initially, a size and ratio of the gear set is specified. Gear friction coefficients are then calculated, and a value for a design target for the gear set is calculated. One or more of the macro-geometry parameters are modified, and the macro-geometry parameters are chosen such that the advantageous effects of one macro-geometry parameter on the design target counteract any disadvantageous effects of another macro-geometry parameter. This allows for a design for a gearset meeting the one or more design targets to be produced. The efficiency calculation includes the effect of a lubricant. Further design targets can include gear noise and gear durability.

15 Claims, 8 Drawing Sheets

(51) Int. Cl.
*F16H 1/28* (2006.01)
*F16H 55/08* (2006.01)
(52) U.S. Cl.
CPC .. *F16H 55/0806* (2013.01); *F16H 2057/0087* (2013.01); *Y02B 10/30* (2013.01)

(56) References Cited

U.S. PATENT DOCUMENTS

| | | | | |
|---|---|---|---|---|
| 5,992,259 | A * | 11/1999 | Fleytman | F16H 1/12 74/425 |
| 6,115,691 | A * | 9/2000 | Ulwick | G06Q 10/06 705/7.32 |
| 6,282,502 | B1 | 8/2001 | Sundaresan et al. | |
| 6,402,652 | B1 * | 6/2002 | Fleytman | B60K 17/35 475/150 |
| 6,464,032 | B1 * | 10/2002 | Fleytman | F16H 1/16 180/245 |
| 6,514,167 | B1 * | 2/2003 | Fleytman | F16H 1/16 475/150 |
| 6,523,430 | B1 * | 2/2003 | Fleytman | B60K 17/34 180/233 |
| 6,582,338 | B1 * | 6/2003 | Fleytman | F16H 48/06 475/227 |
| 6,645,112 | B1 * | 11/2003 | Fleytman | B60K 17/3462 180/249 |
| 7,155,793 | B2 * | 1/2007 | Simon | F16H 3/663 29/407.01 |
| 9,879,760 | B2 * | 1/2018 | Tesar | F16H 1/32 |
| 10,174,810 | B2 | 1/2019 | Brassitos et al. | |
| 2002/0043129 | A1 * | 4/2002 | Fleytman | F16H 55/22 74/724 |
| 2003/0109355 | A1 | 6/2003 | Allen et al. | |
| 2004/0092355 | A1 * | 5/2004 | Fleytman | B60K 23/0808 475/210 |
| 2004/0133404 | A1 | 7/2004 | Morita et al. | |
| 2009/0165585 | A1 * | 7/2009 | Zhuravlev | F16H 55/08 74/462 |
| 2012/0073364 | A1 * | 3/2012 | Hatch | G01H 1/003 73/162 |
| 2013/0085722 | A1 * | 4/2013 | James | G06F 30/15 703/1 |
| 2013/0203543 | A1 * | 8/2013 | Sten | F16H 48/36 475/150 |
| 2013/0216321 | A1 | 8/2013 | Heer | |
| 2014/0274527 | A1 * | 9/2014 | Sten | F16H 1/46 475/150 |
| 2016/0053858 | A1 | 2/2016 | Brassitos et al. | |
| 2016/0178046 | A1 | 6/2016 | Goto et al. | |
| 2018/0003283 | A1 * | 1/2018 | James | G06F 30/17 |

FOREIGN PATENT DOCUMENTS

| | | | |
|---|---|---|---|
| CN | 105550429 A | 5/2016 | |
| EP | 2545299 A1 | 1/2013 | |
| EP | 2587423 A2 * | 5/2013 | G06F 30/23 |
| EP | 2587423 A2 | 5/2013 | |
| GB | 2550986 A | 12/2017 | |
| JP | 2004-133809 A | 4/2004 | |
| JP | 2008-075810 A | 4/2008 | |
| JP | 2010-164134 A | 7/2010 | |
| JP | 2013093018 A1 | 5/2013 | |
| JP | 2013-182501 A | 9/2013 | |

OTHER PUBLICATIONS

Li et al. "A Transient Mixed Elastohydrodynaic Lubrication Model for Spur Gear Pairs", Journal of Tribology, Jan. 2010, vol. 132, 9 pages. (Year: 2010).*
Hohn et al. "Optimization of Gearbox Efficiency", GOMABN, 48, 4, pp. 441-480, 2009. (Year: 2009).*
Michaelis et al. "Influence factors on gearbox power loss", Industrial Lubrication and Tribology, 2011, vol. 63, Iss 1 pp. 46-55. (Year: 2011).*
Xu, Hai. "Development of a Generalized Mechanical Efficiency Prediction Methodology for Gear Pairs", 2005, 258 pages. (Year: 2005).*
Sawalhi, N. "Vibration Sideband Modulations and Harmonics Separation of a Planetary Helicopter Gearbox with Two Different Configurations" 2016, Advances in Acoustics and Vibration, 9 pages. (Year: 2016).*
Ambarisha and Parker (2006): "Suppression of Planet Mode Response in Planetary Gear Dynamics Through Mesh Phasing" Journal of Vibration and Acoustics; Apr. 2006, vol. 128 / 133.
Benedict and Kelley, "Instantaneous Coefficients of Gear Tooth Friction" ASLE TRANSACTIONS 4, 59-70 (1961), Downloaded: Aug. 1, 2013.
Michaelis et al.,"Lubricant Influence on Gear Efficiency" Proceedings of the ASME 2009 International Design Engineering Technical Conferences * Computers and Information in Engineering Conference, Aug. 30, 2009.
Barry James: "Efficiency Improvement in Heavy Duty Axles Confirmed through Re-design and Testing", Sep. 27, 2016, retrieved from the Internet: URL:https://romaxtech.com/media/95897/romax-efficiency-improvement-in-heavy-duty-axles.pdf.
Childs, P.R.N. (Jun. 2014) "Mechanical Design Engineering Handbook", Elsevier.
Geartechnology, Nov./Dec. 2013, Schulze, T., "Design and Optimization of Planetary Gears Considering All Relevant Influences", 96-102.
Mueller, R., Jan. 2015, "Planetary Gear Designer", mueller.ch.
European Search Report in Application No. 17 17 2902 dated Nov. 7, 2017.
Gawande S. H. and Shaikh S. N., "Experimental Investigations of Noise Control in Planetary Gear Set by Phasing" Journal of Engineering, Jun. 2, 2014.
Hohn et al., "Low Loss Gears" GearTechnology, Jun. 2007.
Magalhães et al., "Influence of tooth profile and oil formulation on gear power loss" Tribology International, vol. 43, No. 10, Oct. 1, 2010.
Nadel Bernard A. and Lin Jiang, "Automobile Transmission Design as a Constraint Satisfaction Problem: Modelling the Kinematic Level" vol. 5, No. 3, pp. 137-171, Jan. 1, 1991.
Statfeld et al., "Operation Pressure Angle" Geartechnology, May 2013.
Gumpolstberger et al., "Systematische Synthese und Bewertung von mehrgängigen Plantengetrieben", Aug. 7, 2007.

* cited by examiner

Figure 13

$$\mu_{EHD} = (\mu_{EHD})_R \cdot \left(\frac{p_H}{p_R}\right)^{a_{EHD}} \cdot \left(\frac{v_{\Sigma C}}{v_{R,EHD}}\right)^{b_{EHD}} \cdot \left(\frac{\eta_{oil}}{\eta_R}\right)^{c_{EHD}}$$

$$\mu_F = (\mu_F)_R \cdot \left(\frac{p_H}{p_R}\right)^{a_F} \cdot \left(\frac{v_{\Sigma C}}{v_{R,F}}\right)^{b_F}$$

Figure 14

Dependencies between design variables and design targets

| | Increased number of teeth | Increased helix angle | Increased face width | Increased pressure angle |
|---|---|---|---|---|
| Transmission error | + | + | + | - |
| Efficiency | ++ | + | - | ++ |
| Bending strength | -- | + | + | + |
| Contact strength | | + | + | + |
| Overall design | + | ++ | + | ++ |

Key:
++ Advantageous
+ Slightly advantageous
⋅ Neutral
- Slightly disadvantageous
-- Disadvantageous

GEARSETS

TECHNICAL FIELD

The present invention relates to approaches for designing gearsets.

BACKGROUND ART

Gears have widespread applications in mechanical engineering, and are used in almost all applications where the transfer of rotating power is required. Although other mechanisms exist that can fulfil this purpose (e.g. pulleys, belts and chains), for most applications gears are more suitable because the gear teeth prevent slippage and the power transmission is highly efficient. Gears are used in almost every device that rotates, including gas turbines, steam turbines, wind turbines, mining, agriculture, clocks, mills, domestic appliances, power tools, cars, aerospace, heavy duty vehicles, trains, ships, industrial machinery. Because the number of gears in use is very large, even very small improvements in efficiency or in durability result in significant benefits across many industries. Gear sets include parallel gears, bevel gears, hypoid gears, and worm gears.

A gear design methodology should not only result in better gearset designs, but also save time and costs in the design process. Improving efficiency has many benefits; as well as a reduction in energy consumption and associated cost savings, more efficient systems have reduced cooling requirements. This means potentially lower volumes of lubricant, longer lubricant life, and better durability for the system as a whole. More durable designs are safer and last for longer, reducing the lifetime cost and energy consumption.

Aspects of product performance are defined as a design target. Design targets can include (but are not limited to): product performance, efficiency, packaging within the space constraints, cost, weight, structural deflections and stress, durability and fatigue, bending and contact strength (which can be measured using safety factors), manufacturability, thermal performance, transmission error, sideband distribution, generation of audible noise, mechanical failure due to dynamic input loads, generation of dynamic loads adverse to the user and/or environment, speed and ratio changing, and satisfactory interaction with a control system.

Designing a gearset is complex and time consuming. The engineer needs to know that the gearset is fit for purpose before it is made and to determine this various analytical methods are used to judge the performance or likelihood of failure, followed by optimisation to change the product definition so as to maximise the product performance. Analysis, either by mathematical simulation or other methods such as benchmarking (comparison with similar products), is typically carried out in a computer program and the domain of computer-aided engineering (CAE) has grown based on this intention.

To assess the different design targets and aspects of performance, different mathematical analysis methods are used and these require different models of the system, consisting of different data. As a result, it is typical for CAE models for each failure mode to be built specifically for that failure mode. Indeed, often CAE packages are developed specifically for the purpose of assessing a given design target.

The design of the system evolves as a result of a process, as opposed to undergoing an instantaneous moment of creation. Some of the parameters defining the design are defined at the start of the process, others are not defined until the end.

As a result, different analyses of product performance are carried out at different stages in the design process, even for the same aspect of product performance. Not all the methods are possible at the start. Typically, only relatively simple analyses are possible when the product definition is light, and it is only towards the end of the design process that more complex analyses are possible.

Moreover, for the same design target or aspect of performance, a simple analysis may be carried out early in the design process and then the a more complex analysis may be carried out later on, because the product definition is more mature and contains greater fidelity. Often, these different levels of fidelity require different CAE packages, with all the problems of data transfer, data updates within the design process etc.

In addition, there is a risk that the user will use a detailed analysis when the information describing the system merits only a simple analysis; this may lead to errors in the analysis, yet the user may not know.

There is a further problem with complex analyses. The purpose of any analysis is to guide the design of the product, and so the value of the analysis comes when the result of the analysis is correctly interpreted/understood by the engineering team and the corresponding design decision is made. For a result to be understood, it needs to "make sense" to the engineers and correspond to the way that the engineers understand the system to perform. However, once an analysis becomes highly complex, it is possible that the result will be too complex to be understood or that it does not match the engineers' fundamental understanding of its performance. Thus, even though the analysis result may be the most accurate analysis possible, it will be discarded in the engineering decisions regarding the system.

It is an irony that the engineers' fundamental understanding of the system performance is very closely related to the simple analyses which may have been carried out at the start of the design process. Thus, the tension exists—there is a desire to increase complexity since this is assumed to increase accuracy and product performance, yet take this too far and complex analysis ceases to be of use.

As the design matures through the design process, the increase in data definition represents an increase in investment of time and money into the design, so any identification of potential issues with the design needs to be achieved at the earliest possible opportunity, thereby minimising the financial cost of iterative re-work.

This points to a final tension in the process. The process needs to provide speed of modelling and analysis to give the productivity, yet include all the system influences to provide the accuracy. Analysing a larger system with all of the system influences tends to lead towards a more complex analysis, yet as has been discussed this leads to problems with speed of modelling and analysis and in data interpretation.

The invention described here seeks to resolve this tension by defining a step-by-step design process, where at each stage the appropriate level of fidelity is defined for the input data, physics, and modelling approach, to minimise iteration and enable the designer to make appropriate engineering decisions at each stage of the process.

Much work has been done on optimising gear pairs. Design processes generally fall into three categories:
- "brute force" methods that analyse many combinations of input variables, and are therefore computationally intensive;
- genetic algorithms that find the optimum solution quickly but do not provide any insight into the interactions between design parameters or contribute to understanding of why the optimised design is best;
- manual step-by-step processes that require looping back several times to make a different variable selection if constraints and targets are not met.

One example is an optimisation process for low-loss gears and is a cyclical loop consisting of the steps of: corrections for load reductions in area of contact with high sliding speed; reduction of module down to tooth fracture limit; reduction of transverse contact ratio down to pitting capacity limit; tooth root fillet radius as large as possible; increase of pressure angle; increase of face width; and helix angle for adequate overlap contact ratios [Hohn et al. (2007); Hohn, B. R., Michaelis, K. and Wimmer, A. (2007) 'Low Loss Gears', *Gear Technology*, no. June 2007, pp. 28-35.]. Another for designing tooth geometries consists of the steps of: reducing gear modulus and increase the number of teeth, keeping constant the centre distance using high positive profile shifts; use standard cutting tools with 20.deg. pressure angles; impose a minimum value of the normal contact ratio close to 1.0; impose a total contact ratio close to 2.0; and keep constant the gear safety factors against tooth root breakage and surface pressure [Magalhaes et al. (2010); Magalhães, L., Martins, R., Locateli, C. and Seabra, J. (2010) 'Influence of tooth profile and oil formulation on gear power loss', *Tribology International*, vol. 43, no. 10, pp. 1861-1871 [Online]. DOI: 10.1016/j.triboint.2009.10.001]. A further approach is shown in FIG. 1 [Childs (2014); Childs, P. R. N. (2014) *Mechanical Design Engineering Handbook*, Elsevier].

There are various tools within specialist software packages that can be used to assist in gear design. These tend to be user-driven manual tools in which some of the gear geometry parameters can be changed. Design of Experiments tools can be used to run a full-factorial analysis of combinations of input parameters, and plot the values of design targets for the resulting candidate designs. For example, a gear rating calculation can be carried out, so that the user can see the effect of geometry changes on bending and contact safety factors.

Although these tools are useful for gear design, they do have the limitation of being manually driven so the user must use their own expertise in deciding how to alter the gear geometry, and do not consider all of the design targets (efficiency, durability, NVH). They are therefore not a substitute for a complete design process that guides the user and considers the trade-offs between design targets at each stage.

There are a number of problems associated with current practice disclosed above, and these are identified below.

When selecting tooth numbers, there is a rule of thumb about "hunting" tooth numbers, in which tooth numbers of a gear pair are chosen to have no common factors in order to "even out" wear on the teeth. The gear tooth module is a compromise between strength (generally, larger teeth are stronger) and noise (generally, a large number of smaller teeth are quieter).

At the macro-geometry stage, usually durability (e.g. to ISO 6336) is considered. It is known that contact ratio affects transmission error. The macro-geometry design affects efficiency, noise, and durability, and in practice it is difficult to optimise for one of these targets without disadvantageous effects on the others. A decrease in durability, for example, could mean that the module needs to be increased to make the teeth strong enough, meaning that the design process reverts back to the previous stage as new tooth numbers are selected.

At the micro-geometry stage (with loaded tooth contact analysis and system deflections), the transmission error, durability and efficiency can be calculated, but there is no guidance as to how to improve efficiency. No account is taken of the impact of lubricant other than viscosity.

At each of these three stages there are trade-offs between the three design targets. Some changes will be better for one target and worse for another, yet the guidance is incomplete, meaning there is a risk that the gearbox will not be fit for purpose.

Also, the impact of one decision cannot be traced through the whole process. In moving from each stage to the next there is a one to many correspondence. The final definition of the gearset (tooth numbers, macro-geometry, micro-geometry) is needed to determine the efficiency, durability and noise. Decisions made at the start of the process (e.g. tooth numbers) impact the performance of the final design at the end of the process, yet tracing this causality is not possible so designers cannot easily find their way to the designs that are fit for purpose.

Previously Benedict & Kelley (1961; ASLE Transactions 4, 59-70) have used lubricant viscosity, gear kinematics and load, but no friction modifiers to investigate gear ratings in gear design. This means that the lubricant properties are not fully included in the calculation of gear durability, potentially leading to a design that performs differently when tested than in simulation.

The FVA 345 method [Michaelis K, Höhn B, Doleschel A. Lubricant Influence on Gear Efficiency. ASME. International Design Engineering Technical Conferences and Computers and Information in Engineering Conference, Volume 6: ASME Power Transmission and Gearing Conference; 3rd International Conference on Micro- and Nanosystems; 11th International Conference on Advanced Vehicle and Tire Technologies ( ):71-80. doi:10.1115/DETC2009-86663] is a mechanical test method developed by FZG Munich for determining the frictional behaviour of lubricants using a modified FZG gear test rig. The test method was developed to evaluate the frictional properties of candidate transmission lubricants in relation to a mineral reference oil ISO VG 100 with a typical sulphur-phosphorus additive package. The test results can be expressed in simple correlation factors for no-load, elasto-hydrodynamic (EHD) and boundary lubrication conditions, in comparative steady-state temperature development for given mean values of operating conditions, and in a ranking scale of different candidates. For a more detailed analysis of the expected power loss in a transmission in practice the results of the efficiency test can be introduced into an equation for the mean coefficient of gear friction for the respective oil. Thus the test results can be applied to any gear in practice at any operating conditions for any gear geometry.

The test rig layout is shown in FIG. 11. The test rig uses two gearboxes, a test and a slave gearbox. The gears are loaded by using a load lever and then locking the shafts using a load clutch. The load torque in the circuit is measured using a torque transducer. The electric motor only needs to overcome the losses in both gearboxes, therefore the loss torque (of both gearboxes) can be measured by a torque transducer on the input side. In addition to torques and speeds, the oil temperature is measured and controlled in a narrow range during the testing.

The test sequence consists of a range of unloaded and loaded tests at different temperatures, speeds and loads (contact pressures). A similar test sequence is carried out using the reference oil (ISO VG 100 oil) to constantly check the repeatability of the rig. The relative power loss of a candidate oil compared to the reference oil is obtained for a range of operating conditions.

The mixed lubrication model is based on the Stribeck curve (FIG. 12) which describes the change of gear friction coefficient with lubrication number (speed×viscosity). There are three lubrication regimes:

Boundary lubrication: at low speeds the surface asperities are in contact, the gear friction coefficient is large and independent of speed and viscosity.

Elasto-hydrodynamic (EHD) lubrication: at high speeds the surfaces and asperities are separated by a fluid film, the gear friction coefficient is small but increases with speed.

Mixed lubrication: operating regime between boundary and EHD lubrication, the gear friction coefficient reduces with speed until it reaches its minimum just before entering full fluid lubrication. The load is partly carried by the fluid film and the asperities.

The equations for the coefficients of gear friction $\mu_{EHD}$ for EHD lubrication and $\mu_F$ for boundary lubrication are presented in FIG. 13. The mixed lubrication regime uses a combination of the two coefficients.

The gear friction coefficients $\mu_{EHD}$ and $\mu_F$ for the respective lubrication regimes in FIG. 13 are calculated by power curve fits. In the EHD regime, the exponents $\alpha_{EHD}$ for contact pressure p, $\beta_{EHD}$ for velocity v, and $\gamma_{EHD}$ for viscosity h are used. For the boundary lubrication regime exponents $\alpha_F$ for contact pressure and $\beta_F$ for velocity are used, as the viscosity effect is insignificant under these conditions. The reference conditions used for normalising are $\mu_{EHD,R}$ and $\mu_{F,R}$. The model is simple but able to discriminate between different lubrication regimes (ISO 14179 is not) and able to show the effect of different lubricants (base oil+additives etc., again not possible in ISO 14179). These seven coefficients (highlighted in the above equation) are obtained from power curve fits of the test data, and can be used to calculate the coefficient of gear friction under any combination of pressure, speed, and temperature.

In summary, the FVA345 method enables efficiency to be calculated using data from a standard lubricant test, for any gearset under any operating conditions.

BRIEF DESCRIPTION OF THE INVENTION

There is provided a computer-implemented method for designing a gearset meeting one or more design targets, in which one of the one or more design targets is efficiency, said method comprising the following steps:
a. specifying a size and ratio of the gear set;
b. calculating gear friction coefficients;
c. calculating a value for the design target for the gear set; and
d. modifying one or more macro-geometry parameters so that advantageous effects of one macro-geometry parameter on the design target counteract disadvantageous effects of another macro-geometry parameter;
e. repeating steps a. to d. and producing a design for a gearset meeting the one or more design targets.

BRIEF DESCRIPTION OF DRAWINGS

Embodiments of the present invention will now be described by way of example and with reference to the accompanying drawings, in which:

FIG. 13 shows equations for the coefficients of gear friction $\mu_{EHD}$ for EHD lubrication and $\mu_F$ for boundary lubrication; and FIG. 14 includes a table showing results of sensitivity studies measuring the effects of tooth number and gear macro-geometry parameters on efficiency, contact and bending strength, and transmission error.

DETAILED DESCRIPTION OF THE INVENTION

Figure 1:
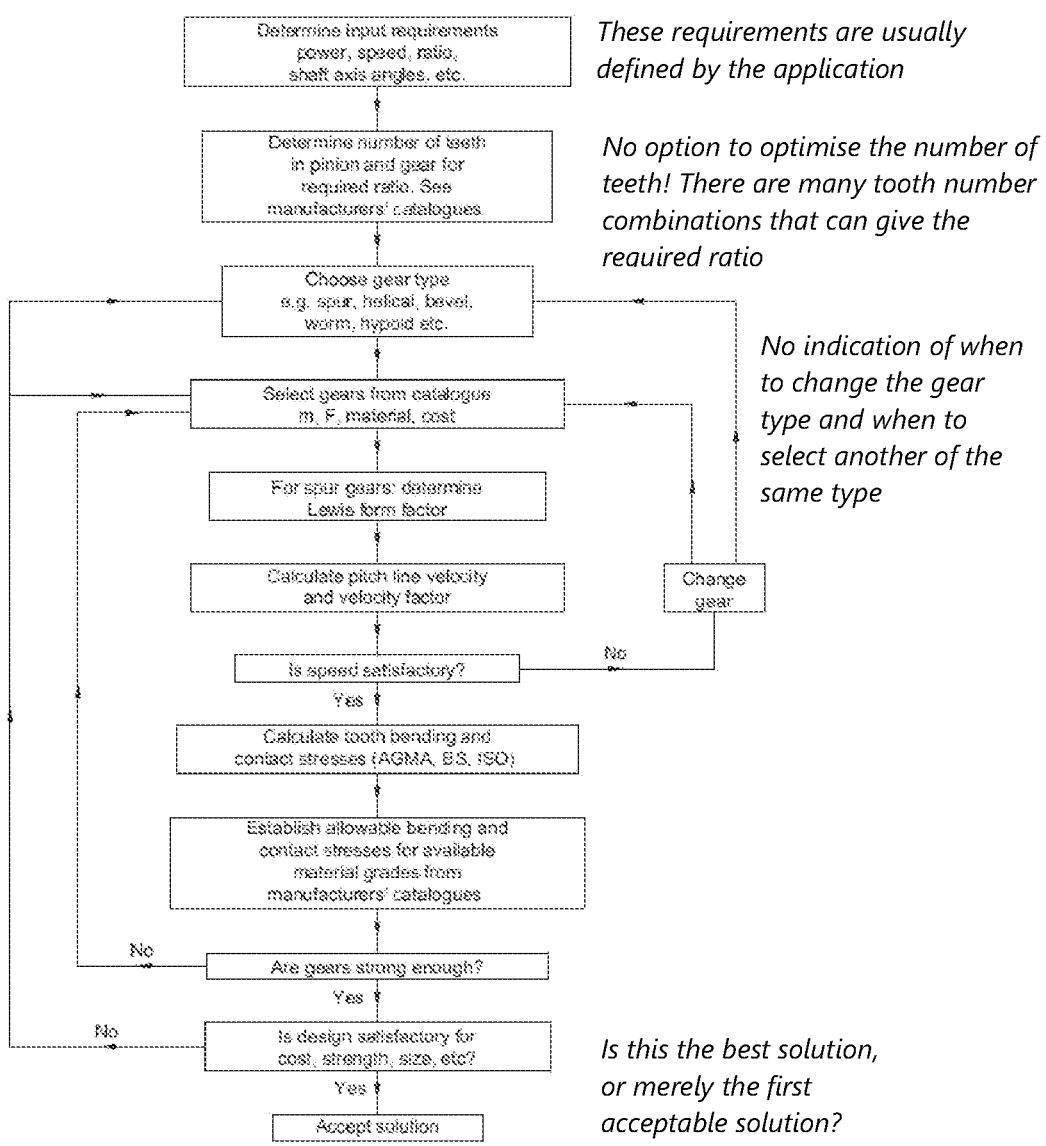
FIG. 1 illustrates a gear design process as defined by Childs (2014), with comments added in italics.

The invention is a multi-stage design process for gearsets, which starts with a very simple gearset definition (size and ratio) and adds detail. At each stage the trade-offs between multiple design targets (for example, efficiency, durability, and NVH) are considered. The design process can quickly generate a set of candidate designs, evaluate against a set of design targets, and identify optimal gearset designs. The efficiency calculation can include the effect of the lubricant (additives and friction modifiers, not just viscosity).

This design process has been developed by understanding how the design targets vary with the values of design variables, and does not just provide results, but also guides the designer to make design decisions which lead to the best trade-off between the targets. The design methodology has been validated via case studies and numerical modelling, and can be implemented in a software program.

The advantages of this approach may be summarised as follows:

All of the physics included in the design targets (for example, efficiency, durability, NVH) is identified at each stage of the design process, and included only if it is affecting the design decision to be made at that stage Trade-offs identified at each stage of the design process, with guidance on how to make performance better in each case Traceability of causality Inclusion of the effect of lubricant on efficiency Potential to supply data to the lubricant manufacturer to enable better lubricant design The method for designing a gearset meeting one or more design targets comprises a number of steps.

The first step is to specify a size and ratio of the gear set. In general, the size and ratio of a gearset is defined by the application. The size (diameter, centre distance, and face width) can be limited by available packaging space.

Patent Application no. US 2013/0085722 A1 describes an approach in which simple "sizing" methods are used for external and planetary gear sets. Whilst these methods are not as accurate or sophisticated as rating methods (such as ISO 6336 or AGMA 2001), they are usable by engineers who are not familiar with the details of gear design and so can be used for the initial stages of transmission and gear design. Further, all the gears defined in this way have a ratio assigned to them as one of the properties. Such sizing methods require "constants", related to the application and material used, which can be obtained by analysing existing transmissions using the same simple analysis methods.

When selecting tooth numbers, options are generated for tooth number combinations that satisfy the following constraints:

ratio requirement (within tolerance);

hunting tooth numbers (optional)

Table 1 lists constraints that can be applied, in terms of the tooth numbers $Z_1$, and $Z_2$ for the two gears.

TABLE 1

Constraints applied to calculate tooth numbers

| Constraint | Mathematical formulation |
| --- | --- |
| Ratio requirement | $Z_1/Z_2$ is within a tolerance of the ratio specified by the user |
| Hunting tooth numbers (optional) | $Z_1$ and $Z_2$ have no common factors |

A starting combination can be, for example, a large number of small teeth, which is good for efficiency. A tooth number combination with a small module/high tooth count is a good starting point. If standard tooling is required for the application, the gear tooth module can be selected from standard values.

Providing a gearset design having a predetermined number of teeth, and predetermined values of macro-geometry parameters (face width, module, pressure angle, helix angle), FIG. 14 captures the main interactions between design variables and design targets in a simple format, and summarises the effect on the design targets of changing the tooth number and macro-geometry parameters.

The table of FIG. 14 is the result of sensitivity studies, in order to measure the effects of tooth number and gear macro-geometry parameters on efficiency, contact and bending strength, and transmission error.

Table 2 below explains how and why the changes in tooth number and macro-geometry affect the design targets. In the table, the font type indicates whether the change is advantageous (underlined), disadvantageous (italicised), or neutral (not underlined, not italicised).

TABLE 3

Interactions between design variables and design targets

| | Transmission error | Efficiency | Bending strength | Contact strength | Contact ratio |
| --- | --- | --- | --- | --- | --- |
| Increased number of teeth | TE reduced due to increased contact ratio | Sliding loss (and wear on the teeth) reduces because the contact path is shorter in smaller teeth. | Bending strength reduces because the teeth are smaller | No effect | Contact ratio increases |
| Increased helix angle | TE reduced due to increased contact ratio; more pairs of teeth in contact at one time give a smoother mesh | Slightly advantageous | Increased contact ratio is better for bending strength; more pairs of teeth in contact can share the load | Increased contact strength | Contact ratio increases |
| Increased face width | TE decreased | Increased sliding loss | Bending strength increases because the teeth are thicker | Increased contact strength | Contact ratio increases for helical gears |
| Increased pressure angle | Increased TE due to reduced tooth height | Power loss decreases with increasing pressure angle | Higher pressure angles result in teeth that are thicker at the base, with greater bending strength. However, higher pressure angles require specialist manufacturing tools. | Slightly increased contact strength | Contact ratio increases |

Thus one or more macro-geometry parameters are chosen for modification such that the advantageous effects of one macro-geometry parameter on the design target counteract any disadvantageous effects of another macro-geometry parameter, and a design for a gearset meeting the one or more design targets is produced.

Sensitivity studies have shown that:

High pressure angles have the effect of increasing both durability and efficiency. There is a slight disadvantageous effect on transmission error, but if this is an issue it can be compensated for with other design changes.

High helix angles are advantageous for noise, efficiency, and bending and contact strength.

An increased face width is advantageous for noise and contact and bending strength, but disadvantageous for efficiency (and may not always be possible given packaging constraints)

Increasing the module/decreasing the number of teeth has no effect on contact strength, is beneficial for bending strength, but is detrimental for efficiency.

Non-standard modules and pressure angles will require non-standard tooling, so may not be economically feasible for low-volume cost-sensitive applications.

The following paragraphs describe how the insight into effects of tooth number and macro-geometry parameters on design targets can be leveraged in the design process, in order to balance the different targets and counteract any disadvantageous effects of design changes.

Increasing the tooth count is beneficial for efficiency, though this means that the teeth are smaller and therefore the change has a disadvantageous effect on bending strength. Increasing helix angle and pressure angle can improve the bending strength, as well as other targets. Larger face widths are mostly advantageous, if permitted by the packaging constraints. Most of the disadvantages of changing the variables in the way described above will be compensated for by other design changes, and a net efficiency benefit should result.

For example, selecting a tooth number combination with a small module/high tooth count, and then counteracting the resulting disadvantageous effect on bending strength from reducing the size of the teeth by one or more of the following:

increasing the pressure angle (if standard tooling is required, the pressure angle can be selected from standard values);

increasing the helix angle (not applicable in spur gearsets);

increasing the face width to the maximum allowed by the packaging space (in some applications this will not be possible);

and any disadvantageous effects of the above changes on other design targets are outweighed by the benefits of having smaller teeth. If the targets for bending strength are not met, a different combination of tooth numbers must be chosen, with a larger module.

A second aspect of the invention is a computer-implemented method for designing a gearset meeting one or more design targets using a combination of the efficiency methods and the sidebands methods disclosed below. The approach is for application to all types of gear pairs (including cylindrical and bevel) and planetary gearsets. Thus, the method combines the following two aspects:

a) Calculation of sidebands;

b) Calculation of non-linear bearing stiffness and system deflections.

The calculation of efficiency can be carried out using a range of different analytical methods. Standard methods have the disadvantage of not considering the lubricant frictional properties. The following standard methods for calculating gear mesh losses are commonly used:

1. A constant friction coefficient is assumed, loaded tooth contact analysis (LTCA) is used to calculate loads and local velocities on the gear teeth, and then the power loss is calculated as the friction coefficient multiplied by the load and the sliding velocity.

2. ISO 14179 considers only the lubricant viscosity, not the frictional characteristics of the lubricant itself (which depend on which base oil(s) and additive(s) the lubricant contains). Lubricant friction characteristics can vary significantly, so the lack of consideration for lubricant properties is a major limitation of the standard.

An alternative to these analytical methods is to use actual test data in the efficiency calculation. For example, a mini traction machine (MTM) can measure the Stribeck curve and slip curve of a lubricant. The test is easy to do, the machine is small and widely available, and can take measurements at different temperatures. The measured data (from an MTM) can be used with loads and local velocities calculated by LTCA to calculate the power loss and related gear mesh efficiency. FVA 345 is one method of including lubricant data in the efficiency calculation.

A similar approach could be achieved using a traction model using a combination of a boundary lubrication model and a model for elasto-hydrodynamic lubrication.

Figure 6:
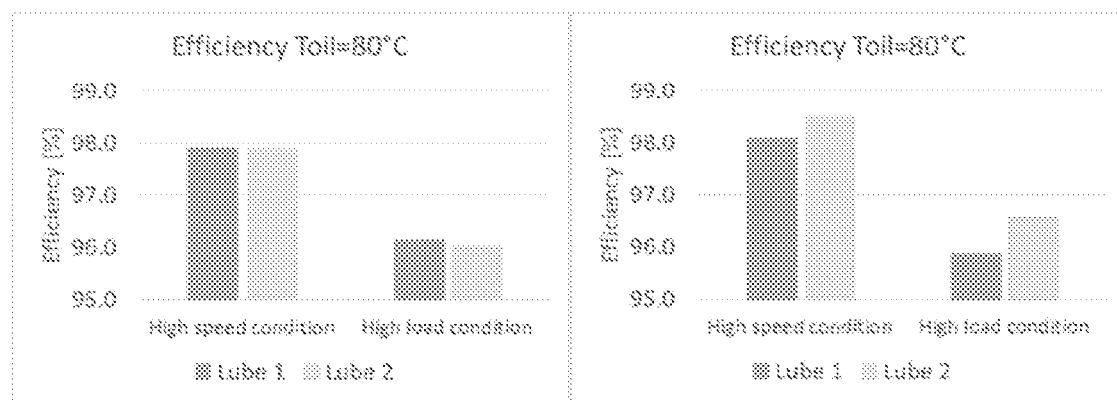
FIG. 6 illustrates the efficiency of two lubricants with similar viscosity and different additives, calculated using ISO 14179 (left) and by using test data from a mini traction machine (right)

FIG. 6 illustrates that two lubricants with similar viscosity but different additives and different frictional properties would give the same value for efficiency according to the ISO 14179 calculation, but give different values for efficiency when calculated using test data from MTM.

Figure 2:
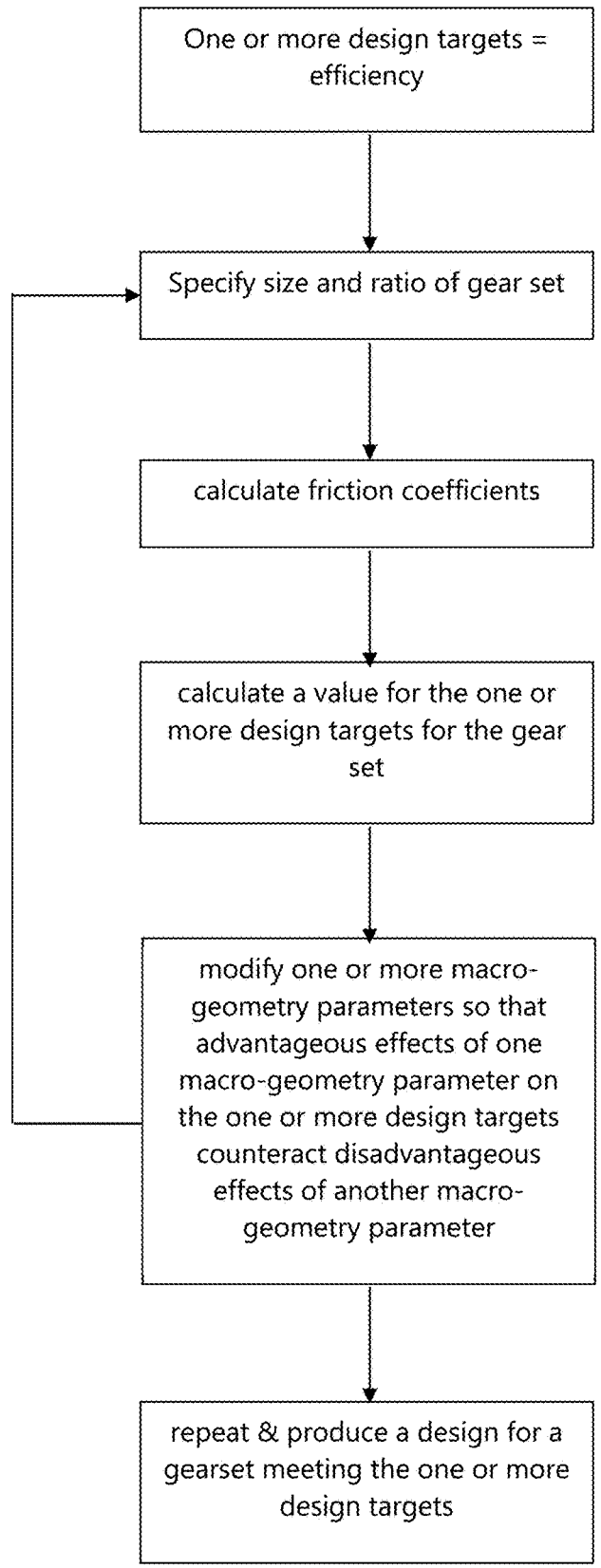
FIG. 2 shows a gear design process of the invention.

FIG. 2 shows a flow chart illustrating the present invention. In current practice, the lubricant is considered only near the end of the design process. Using test data as an input to efficiency calculations not only allows the lubricant performance to be included in the design, but also opens up the potential for the oil company to improve the performance of the lubricant. Data from simulation that characterises the loading and contact conditions under all operating conditions can be made available to the oil company early in the design phase, so the choice of additives and base oils to be used in the lubricant can be decided based on real information about the operation of the gearbox.

In one embodiment the invention uses efficiency calculations including lubricant test data (for example, the FVA 345 method) combined with system deflections and loaded tooth contact analysis (LTCA). System deflections are dependent on shaft deflections, housing deflections, and non-linear bearing deflections. LTCA is a method for analysing the physics of contact between meshing gear teeth, accounting for deflection of the parts of the tooth flank that are in contact, and calculating the stress distribution on the gear tooth flank. The load is dependent on system deflections and micro-geometry, and affects the gear durability and transmission error. Thus, changing the gear tooth micro-geometry affects noise, durability and efficiency if system deflections are included, but the effects can only be fully modelled if the calculations correctly account for lubricant properties. Including lubricant properties in the efficiency calculation can be achieved by FVA 345 method. Non-linear bearing stiffness affects the system deflections and misalignments, which affect the shape of the contact patch between meshing gear teeth, and therefore affect durability/efficiency/noise. Specialist software (for example RomaxDesigner, Kisssoft, MASTA) can be used to calculate non-linear stiffness and system deflections.

Thus, in one embodiment the invention is the combination of:
a) gear efficiency, which can be calculated including the effects of loading, gear kinematics, and lubricant properties (e.g. by FVA 345 method including effects of viscosity, friction modifiers, and additives);
b) LTCA (affecting transmission error, efficiency and durability);
c) system deflections, which are a function of housing deflections, shaft deflections, and non-linear bearing stiffness.

Furthermore, the invention includes the calculation of non-linear bearing stiffness and the use of sideband analysis for gear pairs. Sidebands are formed from transmission error modulated by run-out/eccentricities in the system, which are affected by misalignment. Multibody dynamics tools can calculate sidebands for gear pairs. The combination of sideband calculation and system deflections in the same software package further enhances the production of a design for gearsets, and the process enables the system to be simultaneously optimised for noise, efficiency, and durability.

Once the macro-geometry design of the gearset is complete, the next step is to optimise the micro-geometry. Micro-geometry optimisation is the process of fine tuning the macro-geometry design in order to change the shape of the area on the gear tooth flanks that are in contact as the teeth mesh. This area is called the contact patch. It is possible to optimise the size and position of the contact patch in order to achieve optimal performance in terms of NVH, durability and efficiency. Micro-geometry modifications remove small amounts of material from the gear tooth (resulting in a gear tooth that is no longer a perfect involute). The amount of material removed can be in the order of tens of microns up to hundreds of microns depending on the size of the gear.

Fundamental flank modifications can be applied in the involute direction—profile crowning (barreling) and profile slope—and/or in the axial direction—lead crowning and lead slope. In both directions, both linear and parabolic tip and root relief are available. These are predominantly used for transmission error minimisation.

Figure 7:
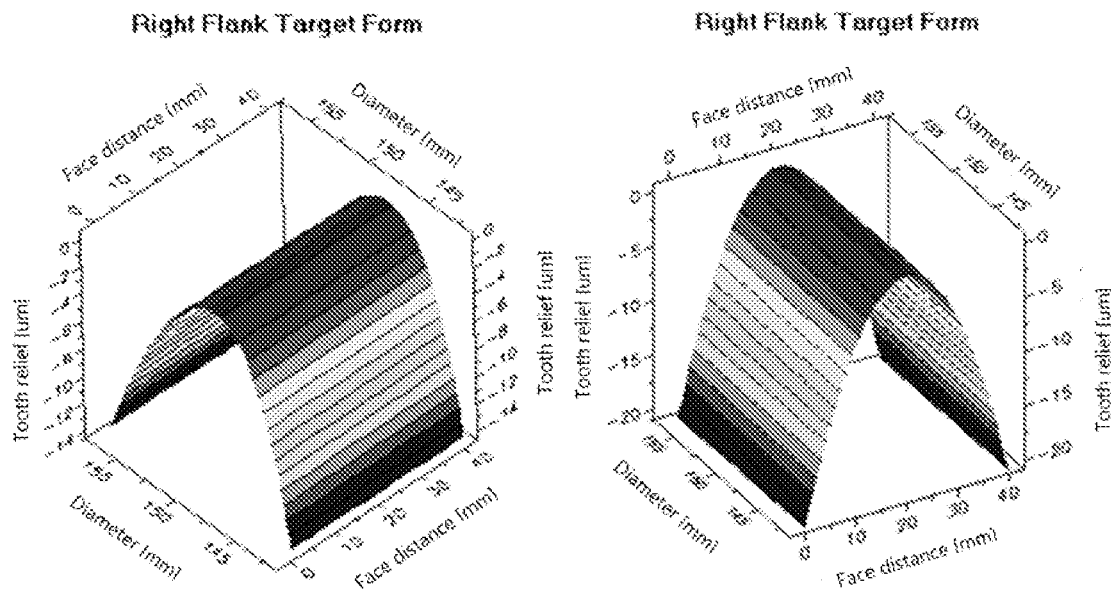
FIG. 7 illustrates an example of profile crowning and lead crowning.

FIG. 7 illustrates the target form by applying profile and lead crowning, which have the effect of bulging the gear flank in the profile and axial directions respectively. Profile crowning has the same effect as applying tip and root relief, and can be useful for gear mesh power loss improvement. However, the bulging of the gear flank can reduce the size of the contact patch, leading to an increased contact stress $\sigma_H$, and therefore an adverse effect on durability and NVH.

Lead crowning is commonly used by gear designers to reduce the sensitivity of the gear mesh to misalignment. This reduces the chances of edge loading (where the contact patch reaches the edge of the tooth rather than remaining in the centre of the flank), which is unfavourable for durability since the likelihood of pitting increases.

Figure 8:
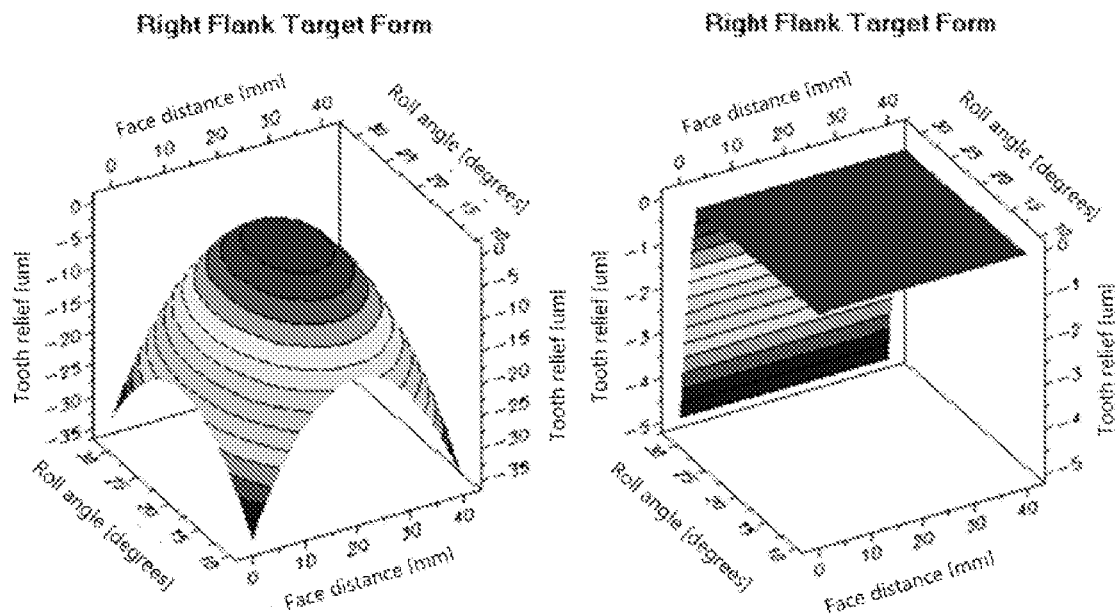
FIG. 8 illustrates a combination of profile (barreling)/lead crowning and an example of linear tip relief.
Figure 9:
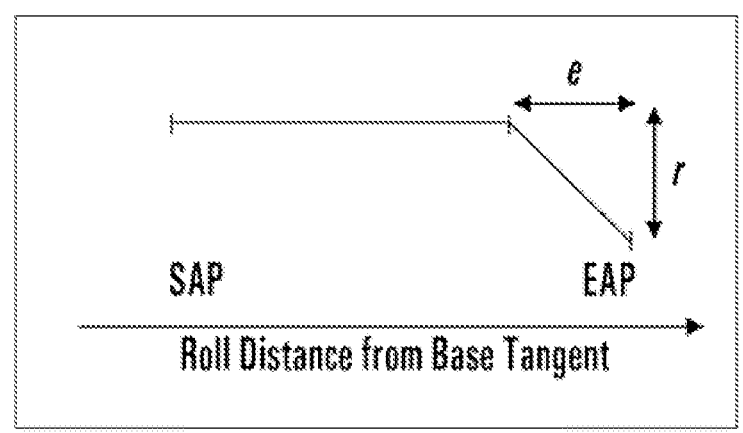
FIG. 9 is a schematic of tip relief.

The first illustration in FIG. 8 shows a combination of barreling and lead crowning together. Clearly it can be seen that the contact area is reduced, and thus the contact stress $\sigma_H$ may increase significantly. The second illustration in FIG. 8 is an example of linear tip relief, where some material is removed from the tip of the tooth flank. The position of the removed material is defined by the roll distance from the base tangent, illustrated schematically in FIG. 9. Tip relief has the advantage of easing the flanks into the mesh and avoiding tip contact. The variation in mesh stiffness is minimised as the contact changes between one and two teeth, and therefore there is a reduction in transmission error (TE). Tip relief can also have the effect of increasing mesh efficiency, as will be discussed later.

Figure 10:
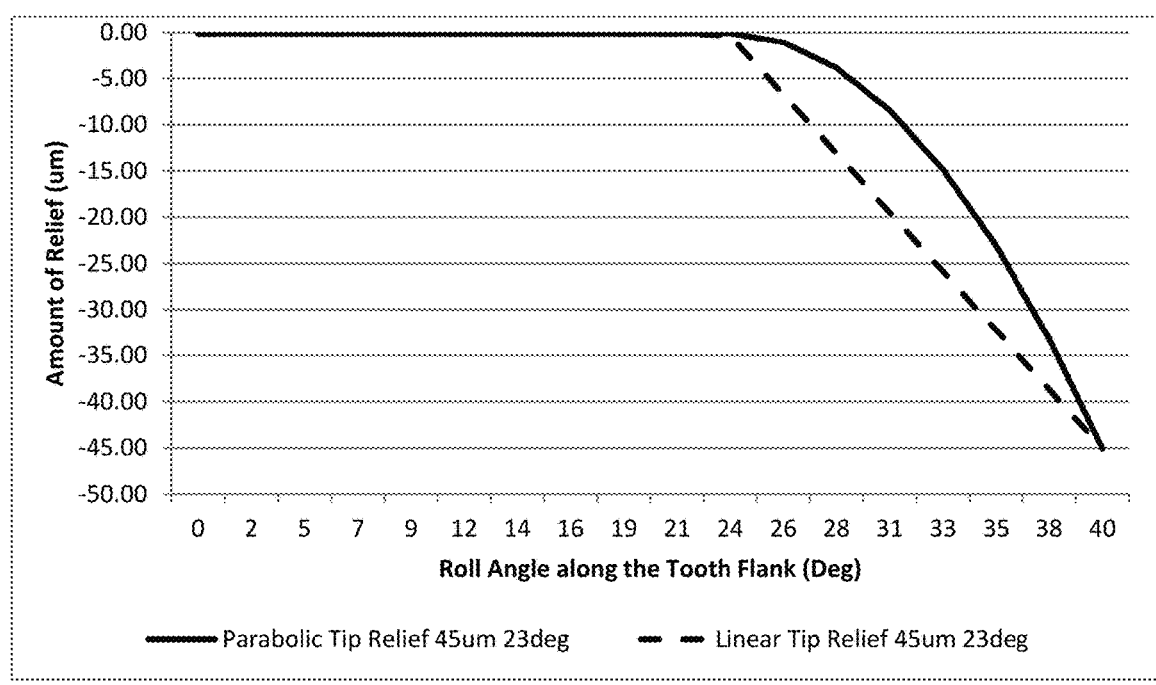
FIG. 10 illustrates a comparison of linear and parabolic tip relief.
Figure 11:
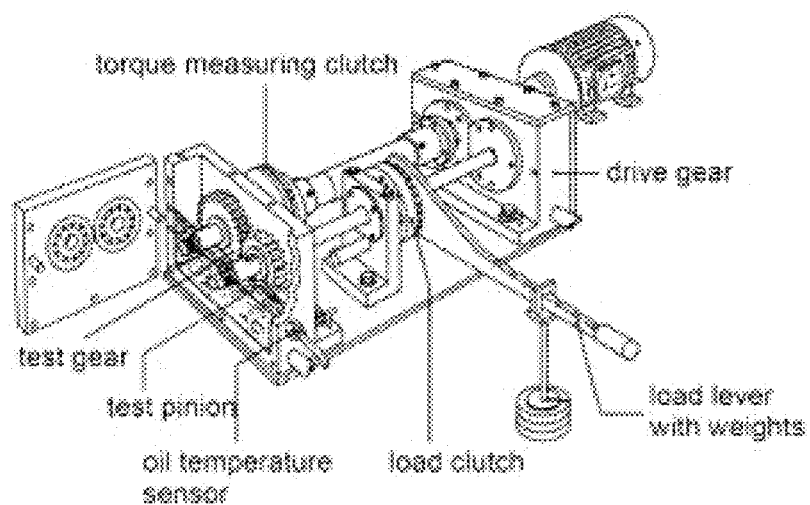
FIG. 11 shows the FZG test rig.
Figure 12:
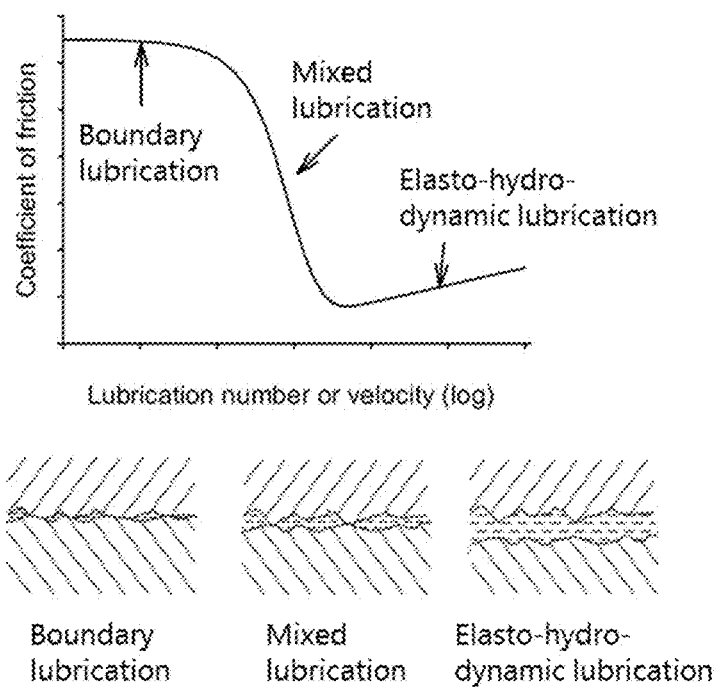
FIG. 12 shows a Stribeck.

Tip relief can be linear or parabolic. Parabolic tip relief is not as effective as linear tip relief for improving mesh efficiency, since less material is removed from the flank. This is demonstrated in FIG. 10. Although linear tip relief is more effective for increasing mesh efficiency, the stress gradient along the flank will be greater, ultimately leading to a higher contact stress. The converse is true for parabolic relief.

Micro-geometry studies can be automated in computer implementations using the Design of Experiments method (DoE). This method allows the entry of parameters and their tolerances so as to investigate all permutations possible within the defined tolerances. Once the macro-geometry of the gears has been selected, then the optimum tip relief to be applied to the chosen macro-geometry design can be determined using DoE.

High lead crowning has the advantage of reducing the sensitivity of the gear mesh total misalignment $F_{\beta_x}$ by ensuring that the contact patch is in a central position on the gear tooth flank. However, this is at the expense of increased contact stress $\sigma_H$.

It is common to apply 'short' tip relief to gears where the emphasis is to minimise TE under light loads. This involves removing only material very close to the tip. Normally, for contact ratios <2, tip relief is applied at the point of highest single tooth contact (HPSTC), since this is where the maximum tooth deflection would occur. However, for gears with higher contact ratios, the HPSTC can be very close to the pitch point. Therefore, applying relief at this point would result in 'long' tip relief, which is not recommended for optimal TE under light loads.

Reducing the tooth height by introducing tip relief has the advantage of easing the teeth into the mesh, thereby reducing the force f(x) in this region. A reduced force also has the benefit of running the gear mesh at a lower temperature, thus minimising the risk of pitting due to thermal stress in the lubricant. Reduced tooth height means that the contact length is reduced, leading to lower power losses due to the gear mesh and therefore higher efficiency.

There are many factors to consider when optimising the shape and size of the contact patch. A large contact patch is good for durability (the load is spread over a wider area, resulting in lower stress on the tooth surface) When more load is applied, the size of the contact patch expands. It is important to keep the contact patch away from the edges of the gear tooth—if the tip of one tooth makes contact with the edge of a meshing tooth, the resulting wear can reduce the durability of the tooth. Tip contact can be prevented by barreling and/or tip relief. Lead crowning reduces sensitivity to misalignment. All of these considerations mean that there are multiple parameters to vary, and multiple design targets (sometimes in opposition). Design of Experiments (DoE) is therefore a good method of evaluating all options and finding an optimum design.

The method for designing the gearset also includes a calculation of a sideband distribution and comparing sideband distribution with a design target for sideband distribution. This can include a sideband distribution outside the design target for sideband distribution. Furthermore, calculating the sideband distribution can include using run out/assembly errors and transmission error.

There are two possible approaches to reduce the level of vibration in gearsets: reducing the source of the noise, or changing the way in which the noise propagates through the system. The invention incorporates both of these approaches.

Reducing the source of the noise (transmission error) can be achieved via micro-geometry modifications, as will be discussed below.

In theory, involute gear teeth mesh perfectly smoothly. In practice, any system will have some slight errors, which can include tooth profile errors, misalignments, run out, or eccentricity due to manufacturing errors or deflection of shafts under load. These errors result in the mesh not being perfectly smooth and the position of the driven gear tooth flank deviating slightly from its theoretical tooth position. This deviation in position is the transmission error, and causes an excitation at the mesh frequency.

Modulations caused by errors and misalignments in a gearset can cause sidebands.

In practice, manufacturing and assembly variability can change the shape of the signals and vary the amplitude. Deviations can be caused by runout, pitch errors, mounting errors, assembly errors, and displacements or misalignments under load. Any of these errors can cause additional modulations to the gear meshing frequency.

Determining the frequency content of errors allows prediction of the sideband orders. For example, "egg" shaped pitch-error or out-of-position error (e.g. radial force such as gravity) causes a once-per-revolution error; ovalisation (e.g. pitch error) causes a twice-per-revolution error; "triangle" shaped error (e.g. three point clamping of a ring gear) causes a three-per-revolution error.

To predict the spectrum of sidebands, it is necessary for the analysis of the gearset to include deflections, misalignments, and manufacturing errors in the model. The mesh misalignment used to calculate sidebands can be calculated based on one or more of non-linear bearing stiffness, shaft deflection, gear backlash, planet carrier stiffness, and housing stiffness. Transmission error can be calculated using loaded tooth contact analysis. Run-out and assembly errors can also be included in the analysis.

The predicted magnitude of sideband excitation and the dynamic response of the system are used to calculate the extent to which an error (e.g. assembly error, tolerance, misalignment) can lead to high radiated noise. The dynamic response of the system to sidebands can be predicted using a 6 degree-of-freedom dynamic model.

Figure 3:
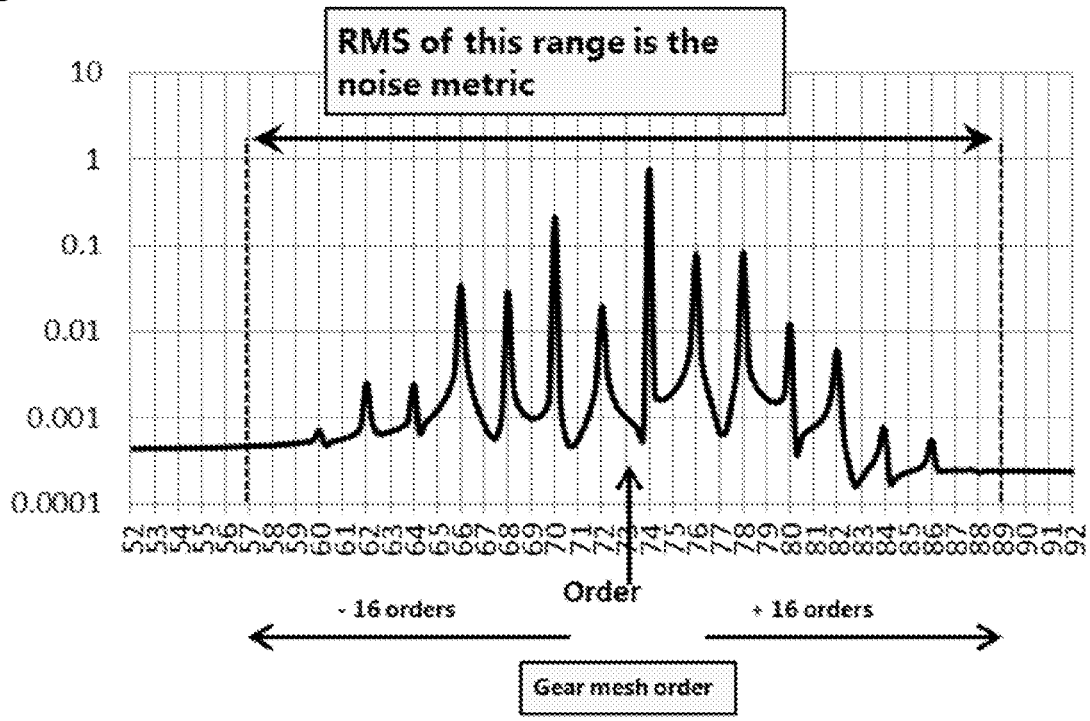
FIG. 3 illustrates the RMS (root mean square) of signal amplitude over a range of frequencies, which can be used as a noise metric.

The sum of the RMS (root-mean-square) response of a frequency range either side of the meshing frequency can be used as a noise metric. Reducing amplitudes of individual sidebands does not necessarily reduce the overall response if the energy is spread across more sidebands (see FIG. 3), so it is useful to consider a frequency range rather than individual sidebands.

It is well known in gear macro-geometry design that to reduce the height of the tooth for the same centre distance and same working normal pressure angle $\theta$, the tooth normal module $m_n$ needs to be reduced (increased number of teeth). This has the effect of increasing the total contact ratio $\varepsilon_\gamma$ which is beneficial for durability and transmission error (TE). Additionally, for the same module $m_n$, increasing the working pressure angle $\theta$ increases the radius of curvature which generates stubbier teeth (same number of teeth) while also reducing the tooth height. However, the consequential reduced contact ratio can have an adverse effect on durability and TE.

Tooth height has a strong influence on the gear mesh efficiency. Power losses can be described in terms of the loss factor $H_v$, which is calculated as $$H_v = \frac{1}{P_{et}} \frac{\int f(x) v_{slip}(x) dx}{f_t v_{tangential}}.$$

$H_v$ can be minimised by reducing the $f(x)v_{slip}(x)$ term. The slip velocity $v_{slip}$ will be maximum furthest away from the pitch point (sliding motion) and zero at the pitch point (pure rolling motion). Thus it is useful to reduce the height of the tooth, which reduces the max slip velocity $v_{slip}(x)$.

A reduction in tooth height can be achieved by i) reducing the module, thus having a larger number of smaller teeth, or ii) introducing tip relief (as will be described later).

Figure 5:
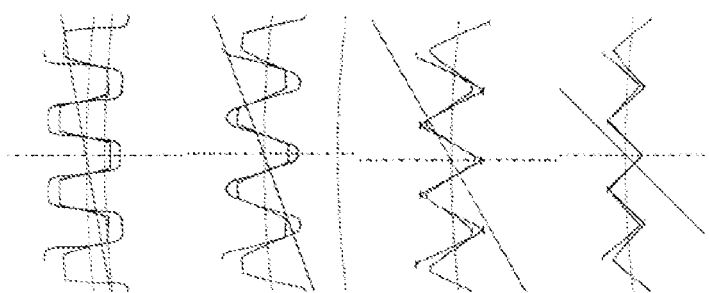
FIG. 5 illustrates the shape of gear teeth with pressure angles of 10, 20, 30, and 45 degrees (left to right)

The pressure angle $\theta$ is the angle between the line of action at the pitch point and the tangent to the base circles. In FIG. 5 this is the angle between the red line and the vertical. For low $\theta$ the shape of the gear tooth is almost rectangular, and as $\theta$ increases the base of the tooth gets thicker and the tip more pointed. At the extremes, $\theta=0°$ would mean that the teeth would effectively be spokes with vertical sides so meshing gears would be locked together and unable to rotate. $\theta=90°$ would yield gears that are perfect circles with no teeth at all.

Increased pressure angles result in reduced sliding and increased rolling of the gear mesh, thus reducing the gear mesh sliding losses and improving efficiency. Bending strength is also increased due to the shape of the gear tooth becoming thicker at the base.

Increasing pressure angle has the disadvantage of increasing bearing load in gear pairs.

Increasingly, the industry is interested in designs with higher working pressure angles. The AGMA standard pressure angle was $\theta=14.5°$, but now pressure angles of 20° and 25° are usual for standard tooling. Hohn et al. (2007) have designed and tested gears with pressure angles of over 40°.

Given the advantages of a higher pressure angle, it is useful to consider the limitations on increasing it further. The main limitations are set out below:

Power transmission. Consider the force F applied at the pitch point where two meshing gears are in contact. This force can be resolved into two components: F cos $\theta$ is the force transferring rotation from one gear to the other, and F sin $\theta$ is a separating force which tries to push the gears apart. A high pressure angle therefore reduces power transmission. In gear pairs, the separating force increases the load on the bearings.

Contact ratio. High-pressure-angle gears have a lower contact ratio, as the short stubby shape of the teeth means that fewer pairs can be in contact at any one time. The total contact ratio must be >1, otherwise there would be periods where the teeth lose contact as the gears rotate. In spur gears this limits the pressure angle to about $\theta=40°$. For helical gears a low transverse contact ratio can be compensated for by the axial contact ratio, so even higher pressure angles can be achieved while maintaining the mesh.

Tooling. For low-volume cost-sensitive applications, it may not be economically feasible to commission new tooling. If standard racks are to be used in manufacturing the design, the pressure angle and module must be a standard value.

Industry norms. Gear designers are conservative and unlikely to accept radical designs without proof that the gears work. Current standards reflect the state of the industry several decades ago, and current industry practice lags behind the advancement of technology.

Relationship between working pressure angle, centre distance, and profile shift coefficient In practice it is more realistic to focus on working pressure angle $\theta_w$ rather than the nominal pressure angle $\theta$. The pressure angle is defined as the angle between the line of centres and the tangent to the contact point between meshing teeth. For gears with standard centre distance CD this point is on the pitch circle. However, if the working centre distance $CD_w$ is increased, the point of contact will move closer to the tip of the gear tooth, resulting in a higher working pressure angle. A gear can therefore be cut with a rack with one pressure angle but operate at a different pressure angle.

$$CD_w \cos \theta_w = CD \cos \theta$$

Figure 4:
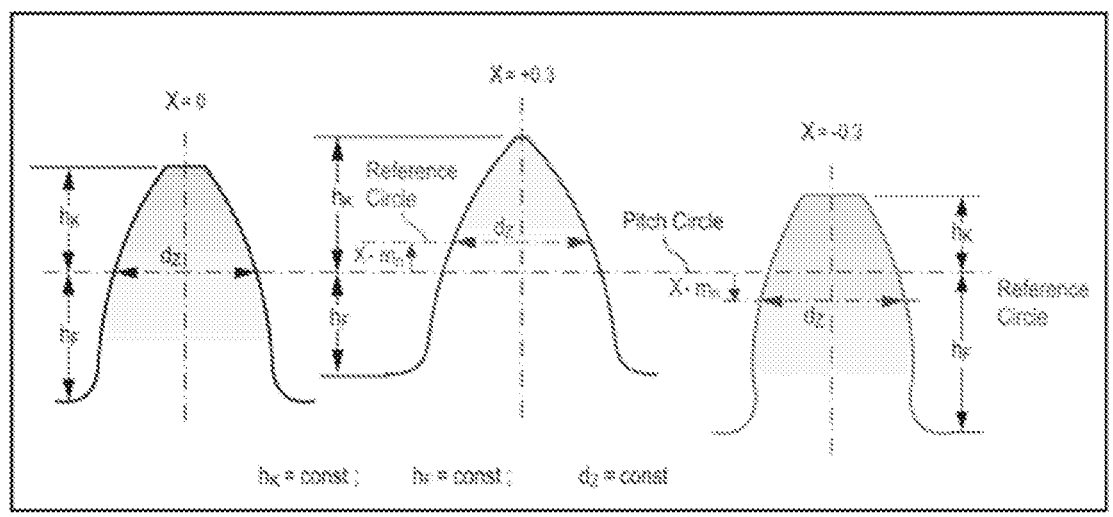
FIG. 4 illustrates the effect of varying profile shift coefficient X (Figure taken from Stadtfeld, 2013 [[Stadtfeld, H. J. (2013) 'Operating Pressure Angle', *Gear Technology*, May 2013, pp. 57-58.]])

The profile shift coefficient (PSC) defines how much of the involute forms the flank of the tooth above and below the pitch circle. FIG. 4 illustrates how the PSC affects the shape of the tooth when the same involute is used.

The height of the tooth above and below the pitch circle are called the addendum and dedendum respectively ($h_K$ and $h_F$ in FIG. 4). The PSC is the difference between these two ($X=h_K-h_F$). Note that the PSC, $h_K$, and $h_F$ are all dimensionless coefficients; the actual dimension is the coefficient multiplied by the module. A tooth with zero PSC has equal addendum and dedendum (FIG. 4, left); a tooth with positive PSC has addendum greater than dedendum (FIG. 4, centre); and a tooth with negative PSC has dedendum greater than addendum (FIG. 4, right).

If a gear pair have equal and opposite PSCs, the centre distance will be the same but the working pressure angle will be different from the nominal pressure angle. Thus a gear pair can have the advantages of a higher working pressure angle but without requiring a change in centre distance, which may affect packaging. Designs with high helix angles are better for efficiency, noise, and bending and contact strength. For helical gearsets, it is therefore advantageous to increase the helix angle as far as is feasible. The only limitation on increasing helix angle is that the axial loads on the gears will be increased. The resulting higher loads on the bearings may lead to increased bearing losses and reduced bearing life. This effect can be mitigated by using double helical gears (two sets of gear teeth with helix angles in opposite directions to cancel out the axial forces), or by replacing the bearing with one with an increased load capacity. These changes incur additional cost, so may not be appropriate in all applications. It should be noted that some heavy-duty applications use spur gears; in these applications, helix angle optimisation will not be applied.

A further consideration for gearset design is in how rigidly the gearset is mounted. There is a trade-off between rigidity and flexibility: rigidity gives good alignment, low misalignment and low run out, and flexibility gives accommodation of errors. Dynamics can be included in this decision making process, by varying the rigidity of the system and simulating the system dynamic response.

The invention claimed is:

1. A computer-implemented method for designing a gearset meeting one or more design targets, in which one of the one or more design targets is efficiency, said method comprising the following steps:

a. specifying a size and ratio of the gear set;
 b. calculating friction coefficients;
 c. calculating a value for the one or more design targets for the gear set; and
 d. modifying one or more macro-geometry parameters, the modified macro-geometry parameters being at least one of helix angle, pressure angle, face width or module, wherein a positive effect on one of the one or more design targets as a result of modifying one of the one or more macro-geometry parameters counteracts any negative effect on the one of the one or more design targets as a result of modifying another of the one or more macro-geometry parameters;
 e. repeating steps b. to d. and producing a design for a gearset meeting the one or more design targets;
 f. automatically modifying one or more micro-geometry parameters, the modified one or more micro-geometry parameters at least relating to a contact patch,
  the automatically modifying the one or more micro-geometry parameters is performed using the Design of Experiments method,
  wherein the Design of Experiments method includes running a full-factorial analysis of combinations of input parameters, and plotting the values of design targets for resulting candidate designs.

2. The method of claim 1, in which the step of calculating a value for the efficiency includes the effect of a lubricant.

3. The method of claim 2, in which properties of the lubricant, including viscosity and additives and friction modifiers, are used.

4. The method of claim 3, in which the efficiency calculation is FVA 345.

5. The method of claim 3, in which the efficiency calculation includes a traction model using a combination of a boundary lubrication model and a model for elasto-hydrodynamic lubrication.

6. The method of claim 2, in which the efficiency calculation includes loaded tooth contact analysis.

7. The method of claim 2, in which the efficiency calculation includes system deflections.

8. The method of claim 7, in which the system deflections include a function of housing, shaft or non-linear bearing stiffness.

9. The method of claim 1, in which the efficiency calculation includes calculation of non-linear bearing stiffness and the use of sideband analysis for gear pairs.

10. The method of claim 1, in which the at least one design target includes gear noise, and gear durability.

11. The method of claim 1, in which said gear set comprises parallel gears, bevel gears, hypoid gears, or worm gears.

12. A computer readable product for computer aided engineering design of a driveline, the product comprising code means for implementing the steps of the method of claim 1.

13. A computer system for computer-aided engineering design of a gearset, the system comprising means designed for implementing the steps of the method of claim 1.

14. A machine including a gearset designed according to the method of claim 1.

15. The method of claim 1, wherein the Design of Experiments method includes entry of parameters and their tolerances so as to investigate all permutations possible within the defined tolerances.

* * * * *